(12) United States Patent
Takahashi et al.

(10) Patent No.: US 6,901,343 B2
(45) Date of Patent: May 31, 2005

(54) MULTILAYER BOARD IN WHICH WIRING OF SIGNAL LINE THAT REQUIRES TAMPER-RESISTANCE IS COVERED BY COMPONENT OR FOIL, DESIGN APPARATUS, METHOD, AND PROGRAM FOR THE MULTILAYER BOARD, AND MEDIUM RECORDING THE PROGRAM

(75) Inventors: Eiji Takahashi, Osaka (JP); Yukihiro Fukumoto, Hirakata (JP); Yoshiyuki Saito, Katano (JP); Osamu Shibata, Moriguchi (JP); Shinichi Tanimoto, Katano (JP); Takeshi Nakayama, Katano (JP)

(73) Assignee: Matsushita Electric Industrial Co., Ltd., Osaka-fu (JP)

(*) Notice: Subject to any disclaimer, the term of this patent is extended or adjusted under 35 U.S.C. 154(b) by 226 days.

(21) Appl. No.: 10/029,571

(22) Filed: Dec. 20, 2001

(65) Prior Publication Data

US 2003/0033108 A1 Feb. 13, 2003

(30) Foreign Application Priority Data

Jan. 10, 2001 (JP) .................................... 2001-002179

(51) Int. Cl.[7] ................................................ H04L 9/32
(52) U.S. Cl. ..................... 702/119; 702/57; 702/62; 702/65; 702/133; 713/194; 713/200
(58) Field of Search ................. 257/202, 207–212, 257/773, 774, 776, 686, 93, 700, 734; 361/760–767, 791, 792, 794, 795; 702/57, 60, 62, 64, 65, 119, 133, FOR 103–104, FOR 106, FOR 111, FOR 157, FOR 155; 713/194, 200; 174/52.1, 52.4, 262, 260, 261, 255, 264, 265, 266; 439/69, 65; 716/1–18

(56) References Cited

U.S. PATENT DOCUMENTS

| | | | | |
|---|---|---|---|---|
| 5,369,299 A | * | 11/1994 | Byrne | 257/638 |
| 5,835,781 A | * | 11/1998 | Van de Steeg et al. | 712/1 |
| 5,905,640 A | | 5/1999 | Hutchison et al. | |
| 5,956,415 A | * | 9/1999 | McCalley et al. | 382/124 |
| 6,164,548 A | * | 12/2000 | Curiel | 235/487 |
| 6,175,088 B1 | * | 1/2001 | Saccocio | 174/262 |
| 6,215,373 B1 | * | 4/2001 | Novak et al. | 333/22 R |
| 6,236,727 B1 | * | 5/2001 | Ciacelli et al. | 380/212 |
| 6,289,455 B1 | * | 9/2001 | Kocher et al. | 713/194 |
| 6,421,013 B1 | * | 7/2002 | Chung | 343/700 MS |
| 6,436,735 B1 | * | 8/2002 | Goetz et al. | 438/125 |
| 2001/0033012 A1 | * | 10/2001 | Kommerling et al. | 257/679 |
| 2002/0002683 A1 | * | 1/2002 | Benson et al. | 713/194 |
| 2002/0195271 A1 | * | 12/2002 | Gailus | 174/262 |

FOREIGN PATENT DOCUMENTS

JP        11-145401        5/1999

* cited by examiner

Primary Examiner—Carol S. W. Tsai

(57) ABSTRACT

A signal line, being in a six-layer board and connecting terminal 102 of component 101 with terminal 115 of component 114, requires tamper-resistance. The signal line is composed of foil 103 on an outside layer, a via 104, foil 111 on the third layer, via 105, foil 112 on the fourth layer, via 106, and foil 113 on the sixth layer. Portions of the signal line that exist on outside layers are all hidden under circuit components. Foil 103 and an end of via 104 are placed under component 101 on first layer 116, an end of via 105 is placed under component 107 on layer 116, an end of via 106 is placed under component 108 on layer 116, the other end of via 104 is placed under component 109 on sixth layer 121, the other end of via 105 is placed under component 110 on layer 121, and foil 113 and the other end of via 106 are placed under component 114 on layer 121.

7 Claims, 34 Drawing Sheets

FIG.6A

| BOARD NO. | SIZE | COMPONENT LIST | NO. OF LAYERS |
|---|---|---|---|
| BOARD 500 | 110mm×60mm | COMPONENT 501<br>COMPONENT 503<br>COMPONENT 505<br>COMPONENT 507<br>COMPONENT 509<br>COMPONENT 511<br>... | 6 |

FIG.6B

| COMPONENT NO. | LAYER | POSITION | TERMINAL LIST |
|---|---|---|---|
| COMPONENT 501 | FIRST LAYER | (10,5)-(41,23) | TERMINAL 523,... |
| COMPONENT 503 | FIRST LAYER | (53,18)-(61,26) | ⋮ |
| COMPONENT 505 | FIRST LAYER | (84,20)-(90,26) | ⋮ |
| COMPONENT 507 | SIXTH LAYER | (24,15)-(38,24) | ⋮ |
| COMPONENT 509 | SIXTH LAYER | (51,23)-(63,31) | |
| COMPONENT 511 | SIXTH LAYER | (71,24)-(101,48) | TERMINAL 524,... |
| ... | | | ... |

FIG.6C

| TERMINAL NO. | LAYER | POSITION |
|---|---|---|
| TERMINAL 523 | FIRST LAYER | (39,11) |
| TERMINAL 524 | SIXTH LAYER | (73,33) |
| ... | ... | ... |

FIG.6D

| SIGNAL LINE NO. | TERMINAL PAIR |
|---|---|
| SIGNAL LINE 555 | TERMINAL 523, TERMINAL 524 |
| ... | |

FIG.7A

| OUTSIDE LAYER WIRING POSSIBLE AREA | POSITION |
|---|---|
| AREA 502 | (10,5)-(41,23) |
| AREA 504 | (53,18)-(61,26) |
| AREA 506 | (84,20)-(90,26) |
| AREA 508 | (24,15)-(38,24) |
| AREA 510 | (51,23)-(63,31) |
| AREA 512 | (71,24)-(101,48) |
| ... | ... |

FIG.7B

| VIA POSSIBLE AREA | POSITION |
|---|---|
| AREA 519 | (24,15)-(38,23) |
| AREA 520 | (53,23)-(61,26) |
| AREA 521 | (84,24)-(90,26) |
| ... | ... |

FIG.7C

| INSIDE LAYER WIRING POSSIBLE AREA |
|---|
| SECOND LAYER |
| THIRD LAYER |
| FOURTH LAYER |
| FIFTH LAYER |

FIG.8

| FOIL NO. | LAYER | POSITION |
|---|---|---|
| FOIL 551 | FIRST LAYER | (39,11)-(31,11)-(31,19) |
| FOIL 552 | THIRD LAYER | (31,19)-(87,19)-(87,25) |
| FOIL 553 | SIXTH LAYER | (87,25)-(87,33)-(73,33) |
| ... | ... | ... |

| VIA NO. | LAYER | POSITION |
|---|---|---|
| VIA 554 | LAYERS 1-6 | (31,19) |
| VIA 555 | LAYERS 1-6 | (87,25) |
| ... | ... | ... |

FIG.12A

| BOARD NO. | SIZE | COMPONENT LIST | NO. OF LAYERS | GROUND/POWER-SOURCE LAYER |
|---|---|---|---|---|
| BOARD 1100 | 110mm×60mm | COMPONENT 1151, COMPONENT 1152, ... | 6 | SECOND LAYER, FIFTH LAYER |

FIG.12B

| COMPONENT NO. | LAYER | POSITION | TERMINAL LIST |
|---|---|---|---|
| COMPONENT 1151 | FIRST LAYER | (10,5)-(41,23) | TERMINAL 1153,... |
| COMPONENT 1152 | SIXTH LAYER | (71,24)-(101,48) | TERMINAL 1154,... |
| ... | ... | ... | ... |

FIG.12C

| TERMINAL NO. | LAYER | POSITION |
|---|---|---|
| TERMINAL 1153 | FIRST LAYER | (39,11) |
| TERMINAL 1154 | SIXTH LAYER | (73,33) |
| ... | ... | ... |

FIG.12D

| SIGNAL LINE NO. | TERMINAL PAIR |
|---|---|
| SIGNAL LINE 1155 | TERMINAL 1153, TERMINAL 1154 |
| ... | ... |

FIG.14

| FOIL NO. | LAYER | POSITION |
|---|---|---|
| FOIL 1160 | FIRST LAYER | : |
| FOIL 1108 | THIRD LAYER | : |
| FOIL 1162 | SIXTH LAYER | : |
| ... | ... | ... |

| VIA NO. | LAYER | POSITION |
|---|---|---|
| VIA 1170 | LAYERS 1-6 | : |
| VIA 1171 | LAYERS 1-6 | : |
| ... | ... | ... |

FIG.18A

| BOARD NO. | SIZE | COMPONENT LIST | NO. OF LAYERS |
|---|---|---|---|
| BOARD 800 | 100mm×50mm | COMPONENT 801<br>COMPONENT 803<br>COMPONENT 814<br>COMPONENT 815<br>COMPONENT 816<br>... | 4 |

FIG.18B

| COMPONENT NO. | SIZE | TERMINAL LIST |
|---|---|---|
| COMPONENT 801 | (31,18) | TERMINAL 802,...<br>TERMINAL 804,...<br>:<br>: |
| COMPONENT 803 | (30,25) | |
| COMPONENT 814 | (10,10) | |
| COMPONENT 815 | (5,10) | |
| COMPONENT 816 | (10,5) | |
| ... | ... | ... |

FIG.18C

| SIGNAL LINE NO. | TERMINAL PAIR |
|---|---|
| SIGNAL LINE 888 | TERMINAL 802, TERMINAL 804 |
| ... | ... |

FIG.19A

| COMPONENT NO. | LAYER | POSITION |
|---|---|---|
| COMPONENT 801 | FIRST LAYER | (5,3)-(36,21) |
| COMPONENT 803 | FOURTH LAYER | (65,23)-(95,48) |

| TERMINAL NO. | POSITION | TERMINAL LIST |
|---|---|---|
| TERMINAL 802 | (34,9) | TERMINAL 802,··· |
| TERMINAL 804 | (63,32) | TERMINAL 804,··· |

FIG.19B

| FOIL NO. | LAYER | POSITION |
|---|---|---|
| FOIL 805 | FIRST LAYER | (34,9)-(28,29)-(28,29) |
| FOIL 808 | SECOND LAYER | (28,29)-(72,29) |
| FOIL 810 | FOURTH LAYER | (72,29)-(72,32)-(63,32) |

| VIA NO. | LAYER | POSITION |
|---|---|---|
| VIA 807 | LAYERS 1-4 | (28,29) |
| VIA 809 | LAYERS 1-4 | (72,29) |

FIG.20

| EXPOSED WIRING | LAYER | POSITION |
|---|---|---|
| FOIL 811 | FIRST LAYER | (28,21)-(28,29) |
| VIA END 819 | FIRST LAYER | (28,29) |
| VIA END 812 | FOURTH LAYER | (28,29) |
| VIA END 813 | FIRST LAYER | (72,29) |

FIG.21

| COMPONENT NO. | LAYER | POSITION | TERMINAL LIST |
|---|---|---|---|
| COMPONENT 814 | FIRST LAYER | (24,21)-(34,31) | ⋮ ⋮ |
| COMPONENT 815 | FOURTH LAYER | (27,23)-(32,33) | ⋮ ⋮ |
| COMPONENT 816 | FOURTH LAYER | (67,26)-(77,31) | ⋮ ⋮ |

| TERMINAL NO. | POSITION |
|---|---|
| ⋮ | ⋮ ⋮ |

FIG.26A

| BOARD NO. | SIZE | COMPONENT LIST | NO. OF LAYERS |
|---|---|---|---|
| BOARD 1400 | 110mm×60mm | COMPONENT 1410<br>COMPONENT 1411<br>... | 6 |

FIG.26B

| COMPONENT NO. | LAYER | POSITION | TERMINAL LIST |
|---|---|---|---|
| COMPONENT 1410<br>COMPONENT 1411<br>... | FIRST LAYER<br>SIXTH LAYER<br>... | ...<br>...<br>... | TERMINAL 1412,...<br>TERMINAL 1413,...<br>... |

FIG.26C

| COMPONENT NO. | POSITION |
|---|---|
| TERMINAL 1412<br>TERMINAL 1413<br>... | ...<br>...<br>... |

FIG.26D

| SIGNAL LINE NO. | TERMINAL PAIR |
|---|---|
| SIGNAL LINE 1455<br>... | TERMINAL 1412, TERMINAL 1413<br>... |

FIG.26E

| FOIL NO. | LAYER | POSITION |
|---|---|---|
| FOIL 1404<br>... | THIRD LAYER<br>... | (20,50)-(20,10)-(60,10)<br>... |

| VIA NO. | LAYER | POSITION |
|---|---|---|
| VIA 1407<br>VIA 1408<br>... | LAYERS 1-6<br>LAYERS 1-6<br>... | ...<br>...<br>... |

FIG.27A

| FOIL NO. | LAYER | POSITION |
|---|---|---|
| FOIL 1404 | THIRD LAYER | (20,50)-(20,10)-(60,10) |

FIG.27B

| GROUND/POWER-SOURCE LAYER |
|---|
| SECOND LAYER<br>FOURTH LAYER |

FIG.28

| FOIL NO. | LAYER | POSITION | CONNECTION TO GROUND |
|---|---|---|---|
| FOIL 1404 | THIRD LAYER | (20,50)-(20,10)-(60,10) | — |
| FOIL 1405 | SECOND LAYER | (20,50)-(20,10)-(60,10) | CONNECTED TO GROUND |
| FOIL 1406 | FOURTH LAYER | (20,50)-(20,10)-(60,10) | CONNECTED TO GROUND |
| ... | ... | ... | ... |

FIG.31
FIG.31A
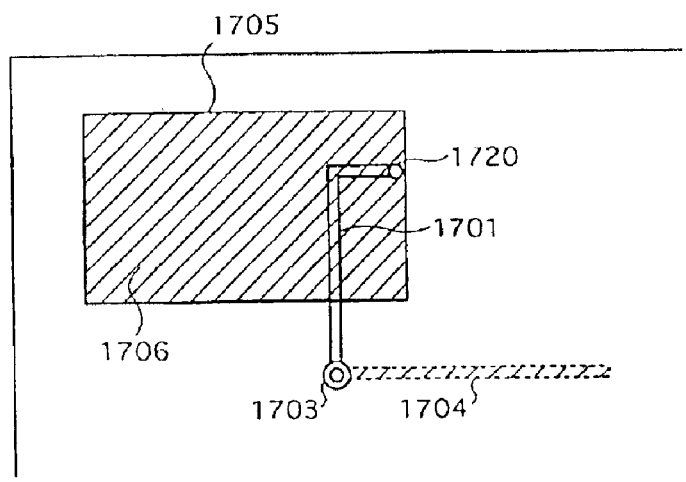
FIG.31B
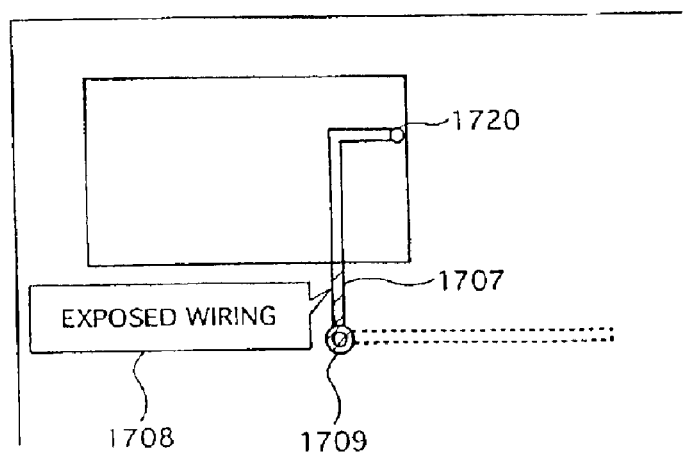

FIG.32A

| BOARD NO. | SIZE | COMPONENT LIST | NO. OF LAYERS |
|---|---|---|---|
| BOARD 1400 | 100mm×100mm | COMPONENT 1705 COMPONENT 1715 | 6 |
| ... | | | |

FIG.32B

| COMPONENT NO. | LAYER | POSITION |
|---|---|---|
| COMPONENT 1705 COMPONENT 1715 | FIRST LAYER SIXTH LAYER | (10,8)-(55,35) |
| ... | | |

FIG.32C

| TERMINAL NO. | LAYER | POSITION |
|---|---|---|
| TERMINAL 1720 TERMINAL 1721 | FIRST LAYER SIXTH LAYER | (53,15) |
| ... | | |

FIG.32D

| SIGNAL LINE NO. | TERMINAL PAIR | TAMPER-RESISTANCE |
|---|---|---|
| SIGNAL LINE 1755 | TERMINAL 1720, TERMINAL 1721 | TAMPER-RESISTANT |
| ... | | |

FIG.32E

| FOIL NO. | LAYER | POSITION |
|---|---|---|
| FOIL 1701 FOIL 1704 | FIRST LAYER THIRD LAYER | (53,15)-(45,15)-(45,45) |
| ... | | ... |

| VIA NO. | LAYER | POSITION |
|---|---|---|
| VIA 1703 | LAYERS 1-6 | (45,45) |
| ... | | ... |

FIG.33

| EXPOSED WIRING | LAYER | POSITION |
|---|---|---|
| FOIL 1707 | FIRST LAYER | (45,35)-(45,45) |
| VIA END 1706 | FIRST LAYER | (45,45) |
| ... | ... | ... |

MULTILAYER BOARD IN WHICH WIRING OF SIGNAL LINE THAT REQUIRES TAMPER-RESISTANCE IS COVERED BY COMPONENT OR FOIL, DESIGN APPARATUS, METHOD, AND PROGRAM FOR THE MULTILAYER BOARD, AND MEDIUM RECORDING THE PROGRAM

BACKGROUND OF THE INVENTION (1) Field of the Invention

The present invention relates to a multilayer board that is highly tamper-resistant, and a design apparatus, method, an program for the multilayer board.

(2) Description of the Related Art

Recently, contents of various fields such as music, still images, moving images, and games have been distributed as digital information thanks to the development of digital information technology and widespread use of digital information communication infrastructures.

Meanwhile, there has always been the fear that the digital contents are acquired by an unauthorized party by means of interception of communications, wiretapping, or disguise, and that the acquired contents are tampered or copied illegally in recording media. It is therefore very important in protecting the right of copyright owners or profits of distributors that any devices to deal with such contents are tamper-resistant, namely, difficult to unauthorized accesses.

Various conventional security technologies are available to make a communication medium tamper-resistant. For example, in a challenge-response type mutual authentication, a transmitting side and a receiving side authenticate themselves by exchanging a random number and a response value, and only when the authentication succeeds, security data protected by copyright is allowed to be transferred between them.

Not only communication media but also multilayer boards containing semiconductors for reproducing contents require tamper-resistance. This is because information passing signal lines on multilayer boards may be probed and reproduced. To make multilayer boards tamper-resistant, therefore, signal lines, which transfer security signals (contents, signals used for authentication, etc.), need be tamper-resistant.

The following methods are known to be used for making such signal lines on multilayer boards tamper-resistant.

(1) All functions contained in a multilayer board are achieved by a one-chip IC so that any security signal does not transferred directly on the multilayer board.

(2) Encryption and decryption processes are embedded into components on the multilayer board. More specifically, a logic for encrypting security signals is embedded into a component for outputting security signals, and a logic for decrypting security signals is embedded into a component for inputting security signals.

(3) Signal lines for transferring security signals on the multilayer board are coated with resin.

Each of the above three methods, however, is to increase the cost since in the first method, existing ICs cannot be used, in the second method, logics for encryption and decryption need be embedded into corresponding components, and in the third method, resin is required as an additional material.

SUMMARY OF THE INVENTION

The object of the present invention is therefore to provide a highly tamper-resistant multilayer board, without increasing the production cost.

The above object is fulfilled by a multilayer board, comprising a signal line requiring tamper-resistance, the signal line including: (a) a conductive trace and (b) a conductive via that passes through layers of the multilayer board, wherein the conductive trace and an end of the conductive via existing on an outside layer of the multilayer board are placed under one or more circuit components mounted on the outside layer.

The above-described construction achieves a highly tamper-resistant multilayer board in which signal lines requiring tamper-resistance on outside layers are difficult to contact probing.

In the above multilayer board, the signal line may further include a conductive trace on an inner layer that is sandwiched between sheets of foil and/or circuit components placed on layers above and below the inner layer so that the sheets of foil and/or circuit components hide the conductive trace on the inner layer when viewed from above or below.

The above-described construction achieves a highly tamper-resistant multilayer board in which signal lines requiring tamper-resistance on inside layers are difficult to non-contact probing such as magnetic probing.

In the above multilayer board, the sheets of foil placed on the layers that are outside the inner layer may be connected to either a ground or a power source.

The above-described construction achieves a highly tamper-resistant multilayer board by enhancing the shielding effect and making the multilayer board to non-contact probing.

In the above multilayer board, the conductive trace on the outside layer may be further covered by a circuit component on another outside layer when viewed from above or below.

The above-described construction achieves a highly tamper-resistant multilayer board in which signal lines requiring tamper-resistance on one outside layer are difficult to non-contact probing tried from the outside layer and the opposite outside layer.

In the above multilayer board, the signal line requiring tamper-resistance may be either a signal line that is input to an encryption unit or a signal line that is output from a decryption unit.

The above-described construction achieves a highly tamper-resistant multilayer board in which signal lines transferring security signals requiring encryption are tamper-resistant.

The above object is also fulfilled by a multilayer board, comprising: a certain signal line that includes (a) a conductive trace and (b) a conductive via that passes through layers of the multilayer board, wherein the conductive trace and an end of the conductive via existing on an outside layer of the multilayer board are placed under one or more circuit components mounted on the outside layer, the certain signal line further includes a conductive trace on an inner layer that is sandwiched between sheets of foil and/or circuit components placed on layers above and below the inner layer so that the sheets of foil and/or circuit components hide the conductive trace on the inner layer when viewed from above or below, and the certain signal line is either a data line or an address line.

The above-described construction achieves a high tamper-resistance in a multilayer board in which security signals are transferred through a plurality of signal lines since all data signal lines and address signal lines on the multilayer board are hidden under components or sandwiched between components or sheets of foil. This construction also makes it difficult for one to identify a signal line among the plurality of signal lines that is transferring a security signal, achieving a highly tamper-resistant multilayer board.

The above object is also fulfilled by a design apparatus for a multilayer board, the design apparatus comprising: a component information acquiring means for acquiring component information that shows (a) positions of circuit components, (b) sizes of the components, and (c) terminals contained by the components; a tamper-resistant signal line specifying means for specifying a signal line that requires tamper-resistance, among signal lines connecting terminals; an outside layer wiring setting means for referring to the component information and setting areas on outside layers covered by circuit components as outside layer wiring possible areas; a via setting means for referring to the component information, detecting an area where a first outside area wiring possible area of one outside layer overlaps another outside area wiring possible area of a second outside layer that is opposite to the first outside layer, when viewed from above or below in a vertical direction, and sets the detected area as a via possible area; and a wiring information generating means for determining a wiring pattern so that signal lines requiring tamper-resistance are wired only in the outside layer wiring possible areas and the via possible area, and generating wiring information that shows the determined wiring pattern.

With the above-described construction, it is possible to design a highly tamper-resistant multilayer board in which signal lines requiring tamper-resistance on outside layers are difficult to contact probing since it is possible to design a wiring pattern so that signal lines requiring tamper-resistance are hidden under components on outside layers, after positions of components are determined.

The above multilayer board may further comprise an inside layer wiring setting means for referring to the component information, detecting an area where a first outside area wiring possible area of one outside layer overlaps another outside area wiring possible area of a second outside layer that is opposite to the first outside layer, when viewed from above or below in a vertical direction, and sets the detected area as an inside layer wiring possible area, wherein the wiring information generating means determines the wiring pattern so that signal lines requiring tamper-resistance are wired only in the outside layer wiring possible areas, the via possible areas, and the inside layer wiring possible area, and generates the wiring information that shows the determined wiring pattern.

With the above-described construction, it is possible to design a highly tamper-resistant multilayer board in which signal lines requiring tamper-resistance are difficult to non-contact probing since it is possible to design a wiring pattern so that such signal lines in inside layers are sandwiched between components on two outside layers, after positions of components are determined.

The above multilayer board may further comprise an opposite layer wiring setting means for referring to the component information and setting areas on one outside layer covered by components as opposite layer wiring possible areas, wherein the wiring information generating means determines the wiring pattern so that signal lines requiring tamper-resistance are wired in areas on another outside layer that is opposite to the outside layer, the areas on the other outside layer overlapping the opposite layer wiring possible areas when viewed from above or below in a vertical direction.

With the above-described construction, it is possible to design a highly tamper-resistant multilayer board in which signal lines requiring tamper-resistance on an outside layer are difficult to non-contact probing performed from the opposite outside layer since it is possible to design a wiring pattern so that such signal lines are hidden under components on the opposite outside layer when viewed from above or below in a vertical direction.

The above object is also fulfilled by a design apparatus for a multilayer board, the design apparatus comprising: a board information acquiring means for acquiring board information that shows (a) the number of layers and (b) ground/power-source layers; a tamper-resistant signal line specifying means for specifying a signal line requiring tamper-resistance; an inside layer wiring setting means for referring to the board information and setting layers sandwiched between two ground/power-source layers as wiring possible inside layers; and a wiring information generating means for determining a wiring pattern so that signal lines requiring tamper-resistance are wired in the wiring possible inside layers, and generating wiring information that shows the determined wiring pattern.

With the above-described construction, it is possible to design a highly tamper-resistant multilayer board in which signal lines requiring tamper-resistance are difficult to non-contact probing since it is possible to design a wiring pattern so that such signal lines in inside layers are sandwiched between ground/power-source layers, after positions of components connecting to the signal lines and a wiring pattern of the signal lines are determined.

The above object is also fulfilled by a design apparatus for a multilayer board, the design apparatus comprising: a board information acquiring means for acquiring board information that shows (a) wiring of signal lines that require tamper-resistance and (b) positions of components connected to the signal lines; an exposed portion detecting means for referring to the board information and detecting portions of the signal lines that are not covered by the components connected to the signal lines on outside layers; and a placement information generating means for determining a placement pattern so that one or more components that have not been placed yet are placed to cover the detected portions, and generating placement information that shows the determined placement pattern.

With the above-described construction, it is possible to design a highly tamper-resistant multilayer board in which signal lines requiring tamper-resistance on outside layers are difficult to contact probing since if a portion of such signal lines not hidden under a component on an outside layer is detected after positions of components connecting to the signal lines and a wiring pattern of the signal lines are determined, it is possible to place any components not having been placed yet to cover the not-hidden portion.

The above design apparatus may further comprise an inside layer wiring detecting means for detecting portions of the signal lines wired on inside layers which are not sandwiched by the components on the outside layers when viewed from above or below in a vertical direction, wherein the placement information generating means determines the placement pattern so that one or more components on one or more outside layers that have not been placed yet are placed to cover the portions detected by the inside layer wiring detecting means when viewed from above or below, and generates the placement information that shows the determined placement pattern.

With the above-described construction, it is possible to design a highly tamper-resistant multilayer board in which signal lines requiring tamper-resistance are difficult to non-contact probing since if a portion of such signal lines in inside layers that is not sandwiched between components on two outside layers is detected after positions of components connecting to the signal lines and a wiring pattern of the signal lines are determined, it is possible to place any components not having been placed yet to sandwich the not-sandwiched portion.

The above design apparatus may further comprise an opposite layer exposed portion detecting means for referring to the board information and detecting portions of the signal lines that are wired on one outside layer and are not covered by components connected to the signal lines on another outside layer that is opposite to the outside layer, wherein the placement information generating means determines the placement pattern so that one or more components on the opposite outside layer that have not been placed yet are placed to cover the portions detected by the opposite layer exposed portion detecting means when viewed from above or below, and generates the placement information that shows the determined placement pattern.

With the above-described construction, it is possible to design a highly tamper-resistant multilayer board in which signal lines requiring tamper-resistance are difficult to non-contact probing since if a portion of such signal lines on an outside layer that is not covered by any components on the opposite outside layer is detected after positions of components connecting to the signal lines and a wiring pattern of the signal lines are determined, it is possible to place any components not having been placed yet on the opposite outside layer to cover the not-covered portion.

The above object is also fulfilled by a design apparatus for a multilayer board, the design apparatus comprising: a board information acquiring means for acquiring board information that shows (a) the number of layers and (b) wiring of signal lines; a tamper-resistant signal line specifying means for specifying a signal line that requires tamper-resistance; a plane layer detecting means for detecting, as plane layers, two layers that sandwich a layer on which the signal line is wired; and a placement information generating means for determining a placement pattern so that sheets of foil on the plane layers cover the wiring of the signal line sandwiched by the plane layers when viewed from above or below in a vertical direction, and generating placement information that shows the determined placement pattern.

With the above-described construction, it is possible to design a highly tamper-resistant multilayer board in which signal lines requiring tamper-resistance are difficult to non-contact probing since it is possible to determine a placement pattern of planes so as to sandwich wiring of the signal lines in inside layers, after a wiring pattern of the signal lines is determined.

The above object is also fulfilled by a design check apparatus for a multilayer board, the design check apparatus comprising: a board information acquiring means for acquiring board information that shows (a) wiring of a signal line that requires tamper-resistance and (b) placement of components; an exposed portion detecting means for referring to the board information and detecting portions of the signal line that are not covered by the components on outside layers; and a warning means for outputting a warning indicating the portions detected by the exposed portion detecting means.

With the above-described construction, it is possible to check whether a tamper-resistant design has been done since if a portion of a signal line that requires tamper-resistance but is not hidden under a component on an outside layer is detected, the portion is indicated by the warning, during or after a design of the multilayer board.

The above design check apparatus may further comprise: an inside layer uncovered portion detecting means for referring to the board information and detecting portions of the signal line in inside layers that are not sandwiched between components or sheets of foil placed on two outside layers when viewed from above or below in a vertical direction, wherein the warning means further outputs a warning that indicates the portions detected by the inside layer uncovered portion detecting means.

With the above-described construction, it is possible to check whether a highly tamper-resistant design has been done since if a portion of such a signal line that is not sandwiched between components or sheets of foil on two outside layers is detected, the portion is indicated by the warning, during or after a design of the multilayer board.

The above design check apparatus may further comprise: an opposite layer uncovered portion detecting means for referring to the board information and detecting portions of the signal line that are wired on one outside layer and are not covered by components on another outside layer that is opposite to the outside layer when viewed from above or below in a vertical direction, wherein the warning means further outputs a warning indicating the portions detected by the opposite layer uncovered portion detecting means.

With the above-described construction, it is possible to check whether a highly tamper-resistant design has been done since if a portion of such a signal line that is wired on one outside layer and is not covered by components on the opposite outside layer is detected, the portion is indicated by the warning, during or after a design of the multilayer board.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings:

FIG. 6A shows the board information;

FIG. 6B shows the component information;

FIG. 6C shows the terminal information;

FIG. 6D shows signal line information;

FIG. 7A shows an outside layer wiring possible area;

FIG. 7B shows a via possible area;

FIG. 7C shows an inside layer wiring possible area;

FIG. 8 shows generated wiring information;

FIG. 12A shows the board information;

FIG. 12B shows the component information;

FIG. 12C shows the terminal information;

FIG. 12D shows signal line information;

FIG. 14 shows generated wiring information;

FIG. 18A shows the board information;

FIG. 18B shows the component information;

FIG. 18C shows the signal line information;

FIG. 19A shows the placement information that shows the determined positions of the components connecting to the signal line requiring tamper-resistance;

FIG. 19B shows the wiring information;

FIG. 20 shows the exposed wiring;

FIG. 21 shows the generated placement information;

FIG. 26A shows the board information;

FIG. 26B shows the component information;

FIG. 26C shows the terminal information;

FIG. 26D shows the signal line information;

FIG. 26E shows the wiring information;

FIG. 27A shows the detected tamper-resistant wiring area;

FIG. 27B shows the tamper-resistant ground/power-source layers;

FIG. 28 shows the generated plane placement information;

FIGS. 31A and 31B show a multilayer board;

FIG. 32A shows the board information;

FIG. 32B shows the component information;

FIG. 32C shows the terminal information;

FIG. 32D shows the signal line information;

FIG. 32E shows the wiring information;

FIG. 33 shows the exposed wiring information; and

DESCRIPTION OF THE PREFERRED EMBODIMENT

The following describes embodiments of the present invention with reference to the attached drawings.
Tamper-Resistant Signal Lines Tamper-resistant signal lines in a circuit embedded in a multilayer board will be described first.

Figure 1:
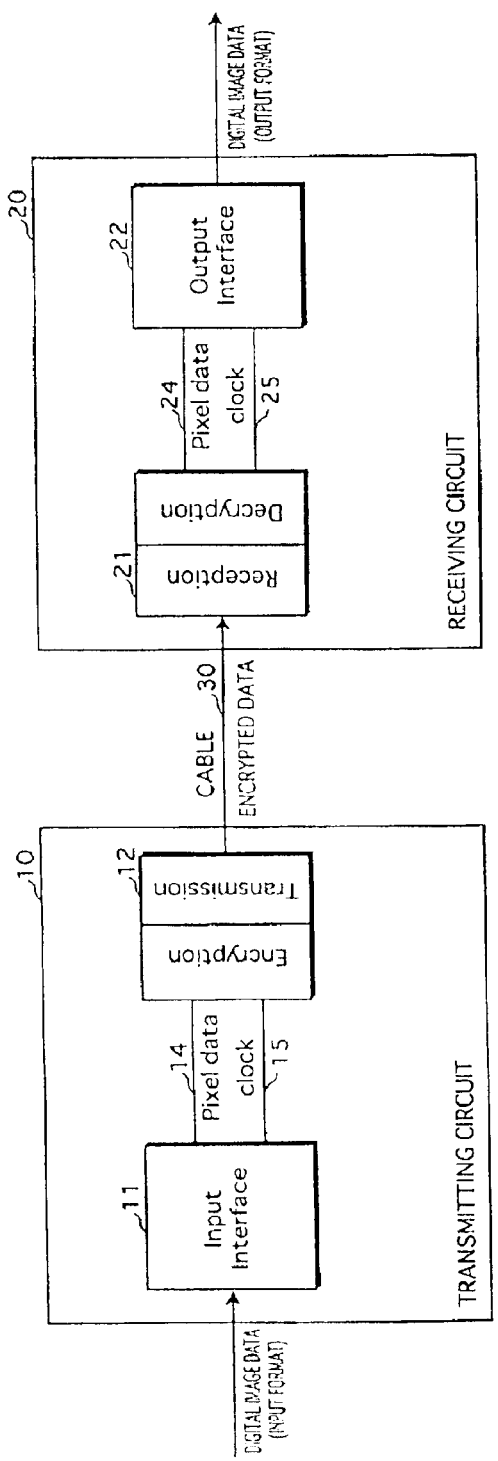
FIG. 1 shows a circuit used in a digital image transmission system.

FIG. 1 shows a circuit used in a digital image transmission system.

As shown in FIG. 1, a transmitting circuit 10 includes an input interface component 11 and an encryption/transmission component 12. The input interface component 11 inputs, from outside, digital image data in a format dedicated to the input from outside. The input interface component 11 transmits pixel data and clocks to the encryption/transmission component 12 via signal lines 14 and 15, respectively. The encryption/transmission component 12 encrypts the received pixel data in accordance with the received clocks, and transmits the encrypted data to a receiving circuit 20 via a cable 30.

The signal line 14 used to transfer pixel data to be encrypted requires tamper-resistance so that the pixel data is not copied in an unauthorized manner.

The receiving circuit 20 includes a reception/decryption component 21 and an output interface component 22. The reception/decryption component 21 receives and decrypts the encrypted data to obtain pixel data. The reception/decryption component 21 transmits the pixel data and clocks to the output interface component 22 via signal lines 24 and 25, respectively. The output interface component 22 converts the received pixel data to a format dedicated to output, and outputs the converted data as digital image data.

The signal line 24 used to transfer pixel data after the decryption requires tamper-resistance so that the pixel data is not copied in an unauthorized manner.

Up to now, examples of signal lines requiring tamper-resistance in a circuit for transmitting digital image data have been explained. However, the signal lines that require tamper-resistance are not limited to the above-described signal lines. The signal lines that require tamper-resistance include, in general, (a) signal lines used to transfer data before encryption to an encryption component and (b) signal lines used to transfer data after decryption that is output from a decryption component, for example. The signal lines that require tamper-resistance also include, in general, signal lines used to transfer data to be encrypted for prevention from being probed in an unauthorized manner.

Embodiment 1

Figure 2:
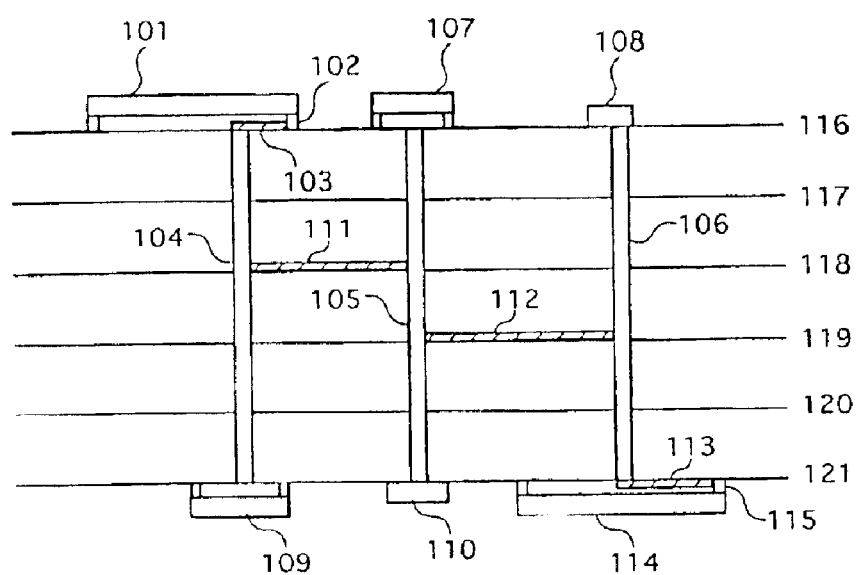
FIG. 2 shows the construction of a multilayer board in Embodiment 1.

Embodiment 1 relates to a multilayer board in which if a signal line that requires tamper-resistance has a portion that appears on an outside layer, the portion is placed under a component on the outside layer so as to be covered by the component.
Construction FIG. 2 shows the construction of a multilayer board in Embodiment 1. The present embodiment describes the case of a six-layer board. As shown in FIG. 2, the multilayer board includes the first layer 116, the second layer 117, the third layer 118, the fourth layer 119, the fifth layer 120, and the sixth layer 121. Of these, the first layer 116 and the sixth layer 121 are outside layers and the other layers are inside layers. It is supposed here that the signal line connecting a terminal 102 of a component 101 with a terminal 115 of a component 114 that requires tamper-resistance. The signal line is composed of foil 103 on an outside layer, a via 104, foil 111 on the third layer, a via 105, foil 112 on the fourth layer, a via 106, and foil 113 on the sixth layer.

It should be noted here that in the following embodiments Embodiment 1 inclusive, each foil constituting a signal line is provided as an example, but any conductive trace may be used instead of foil.

Out of the portions constituting the signal line that requires tamper-resistance, the portions that exist on the outside layers are placed under certain components. That is to say, the foil 103 and an end of the via 104 are placed under the component 101 on the first layer 116, an end of the via 105 is placed under the component 107 on the first layer 116, an end of the via 106 is placed under the component 108 on the first layer 116, the other end of the via 104 is placed under the component 109 on the sixth layer 121, the other end of the via 105 is placed under the component 110 on the sixth layer 121, and the foil 113 and the other end of the via 106 are placed under the component 114 on the sixth layer 121.

SUMMARY

As described above, in the multilayer board of the present embodiment, (a) sheets of foil that are placed on the outside layers and constitute such signal lines as require tamper-resistance and (b) vias that pass through layers for connection and constitute such signal lines as require tamper-resistance are placed under certain components on the outside layers. This makes it difficult for anyone to probe the signal line by contact and achieves a highly tamper-resistant multilayer board.

Variations

The present invention is not limited to the above-described embodiment and can be varied as follows.

(1) In the case of the present embodiment, only the vias that pass through all layers constituting the multilayer board are used. However, such vias as pass through only certain layers among all the layers may be used. In this case, the ends of the vias on the outside layers are placed under certain components so that the ends are not exposed to outside.

(2) In the case of the present embodiment, a six-layer board is used as a multilayer board. However, the number of the layers constituting the multilayer board may be two or more.

(3) It is desirable that the components used in the present and all the other embodiments do not have holes on the sides thereof so that a probe cannot be inserted into a hole on the side.

Embodiment 2

The present embodiment relates to a multilayer board in which if a signal line that requires tamper-resistance has a portion on one inside layer, the portion is sandwiched between sheets of foil on layers that are above and below the inside layer.

Construction

Figure 3:
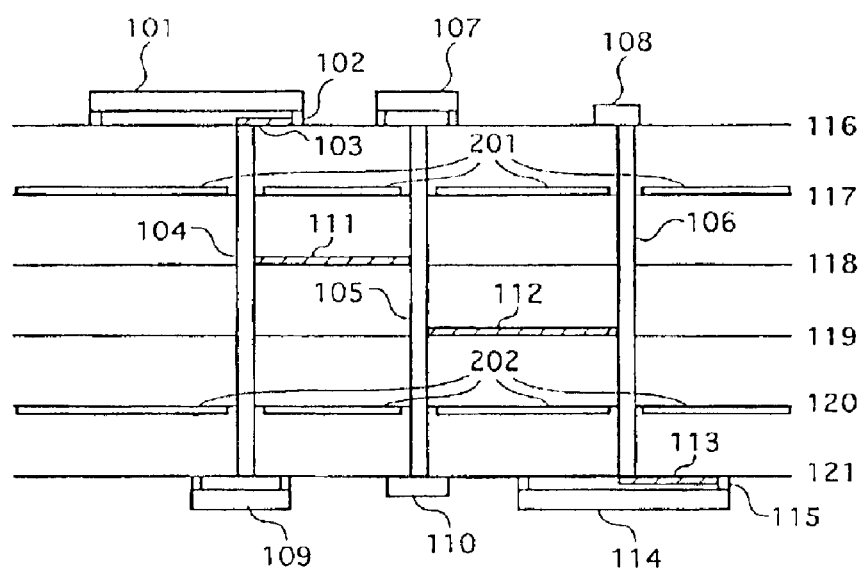
FIG. 3 shows the construction of a multilayer board in Embodiment 2.

FIG. 3 shows the construction of a multilayer board in Embodiment 2. The same components in FIGS. 2 and 3 have the same numbers and will not be explained in detail here. Differences will be focused in the following description.

In the present embodiment, if a signal line that requires tamper-resistance has a portion on one inside layer, the portion is sandwiched between planes (sheets of foil) so that the signal line is protected from magnetic probing. More particularly, the foil 111 on the third layer 118 and the foil 112 on the fourth layer 119 are sandwiched between planes 201 and planes 202.

SUMMARY

As described above, in the multilayer board of the present embodiment, sheets of foil that are placed on the inside layers and constitute such signal lines as require tamper-resistance are sandwiched between planes on layers that are outside the inside layers. This provides a shielding effect and protects the signal line from non-contact probing such as magnetic probing, achieving a highly tamper-resistant multilayer board.

Variations

The present invention is not limited to the above-described embodiment and can be varied as follows.

(1) The plane 201 may be on any layer in so far as it is on a layer that is outside the layers having the sheets of foil 111 and 112 thereon, and may be on the first layer 116, for example. This applies to the plane 202, and therefore may be on the sixth layer 121, for example.

(2) To increase the shielding effect, the planes 201 and 202 may be connected to a power source or a ground.

(3) The sheets of foil 111 and 112 may be sandwiched between components on an outside layer and planes on an inside layer. Also, the foil 111 and 112 may be sandwiched between components on the two outside layers.

(4) In the present embodiment, the target to be protected from non-contact probing is sheets of foil on inside layers. However, ends of vias that constitute a signal line that requires tamper-resistance may be sandwiched between components or sheets of foil, as well.

(5) In the present embodiment, the target to be protected from non-contact probing is portions of a signal line placed on inside layers. However, there is a case in which a portion of a signal line placed on an outside layer should be protected from non-contact probing that is performed from the opposite outside layer. To deal with the case, (a) the target portion of the signal line is placed in an area on the first layer, the area corresponding in the vertical direction to an area covered by a component on the sixth layer or an area covered by foil on an inside layer; or (b) the target portion of the signal line is placed in an area on the first layer, the area corresponding in the vertical direction to an area covered by foil on the second layer, for example.

(6) In Embodiments 1 and 2, portions of a certain signal line that requires tamper-resistance are placed under certain components or sandwiched between components or sheets of foil. However, this arrangement may be extended to all data signal lines and address signal lines of the multilayer board.

Embodiment 3

The present embodiment relates to a design apparatus that determines a wiring pattern so that a certain signal line becomes tamper-resistant, after positions of components are determined.

Construction

Figure 4:
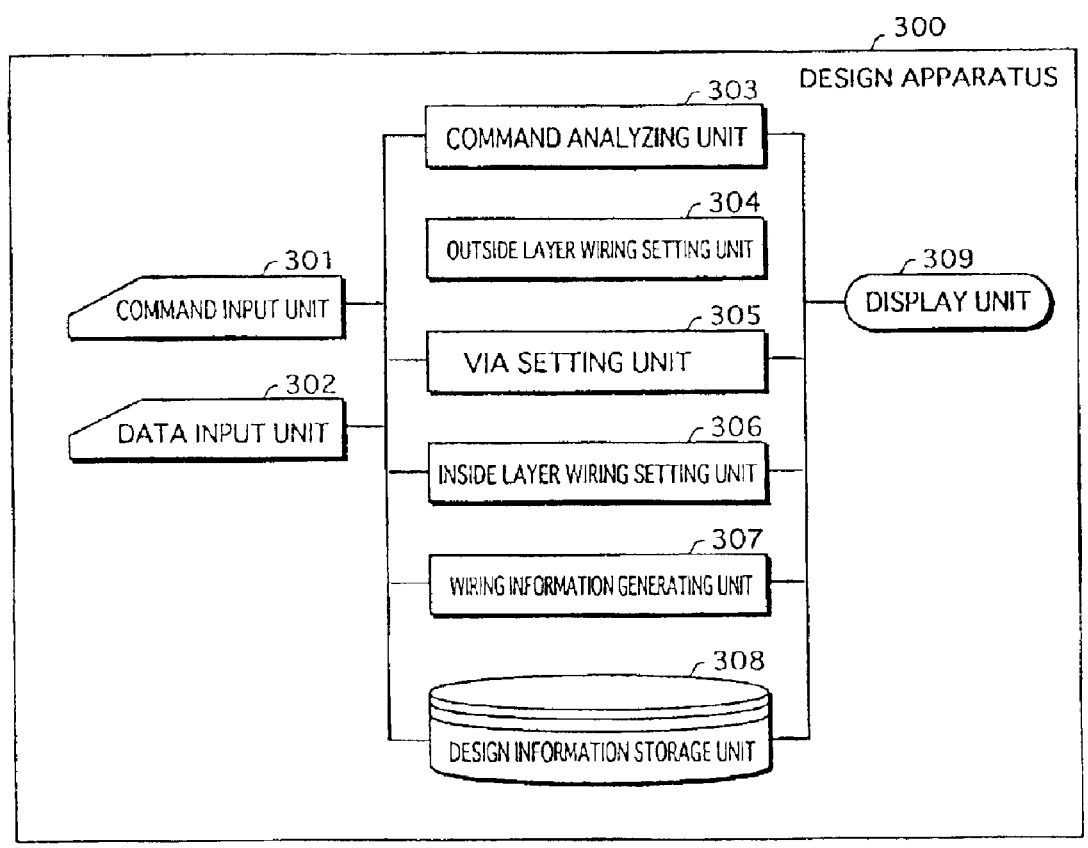
FIG. 4 is a block diagram showing the construction of a design apparatus in Embodiment 3.

FIG. 4 is a block diagram showing the construction of a design apparatus in Embodiment 3. As shown in FIG. 4, the design apparatus 300 includes a command input unit 301, a data input unit 302, a command analyzing unit 303, an outside layer wiring setting unit 304, a via setting unit 305, an inside layer wiring setting unit 306, a wiring information generating unit 307, a design information storage unit 308, and a display unit 309.

Figure 5A:
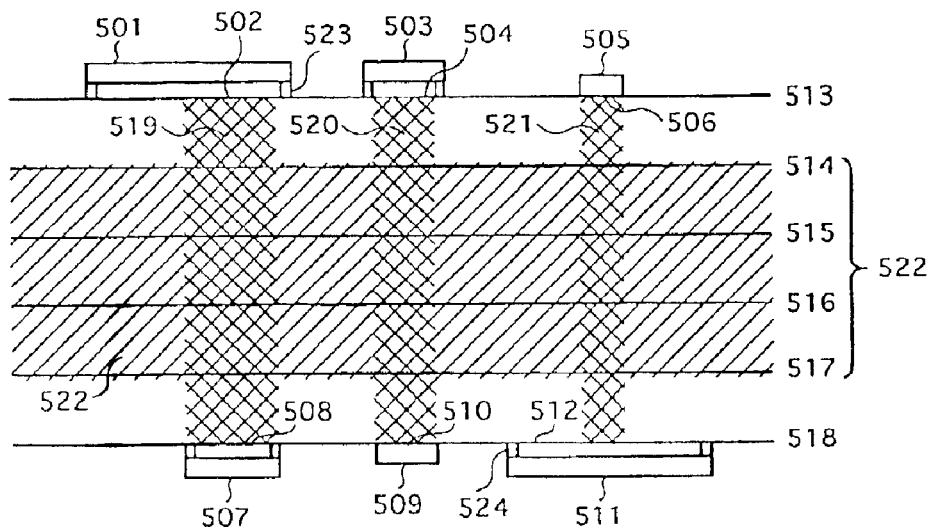
FIG. 5A is a cross section of the multilayer board.
Figure 5B:
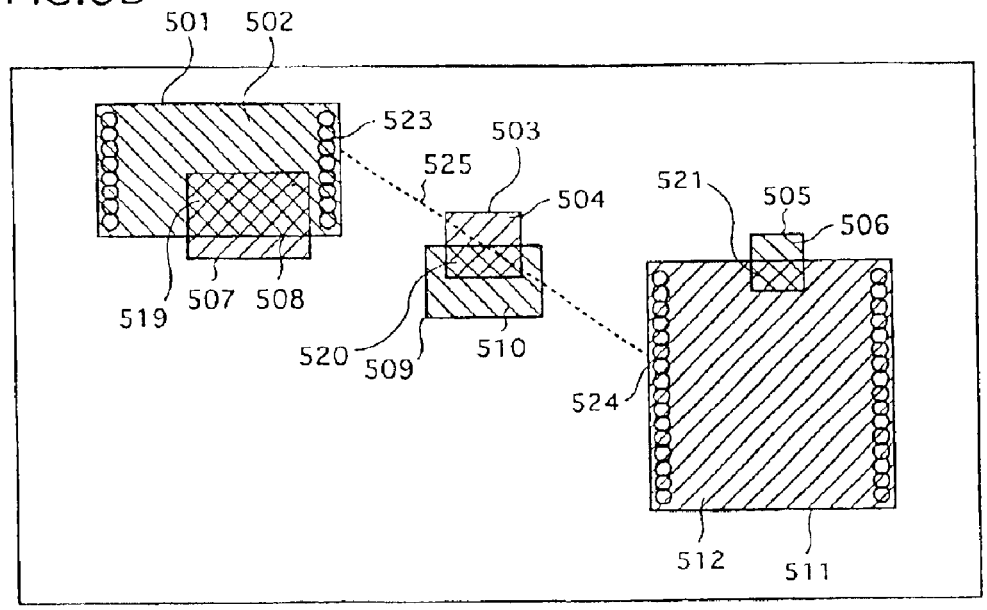
FIG. 5B is a top plan view of the multilayer board.

FIG. 5A is a cross section of the multilayer board. FIG. 5B is a top plan view of the multilayer board. Now, the components of the design apparatus 300 will be described with reference to these drawings.

The display unit 309 displays design processes of a target wiring board on the screen.

The data input unit 302 inputs circuit diagram information and design information or the like which are created by using a CAD apparatus or the like. The design information includes board information, component information, and terminal in formation. FIG. 6A shows the board information. FIG. 6B shows the component information. FIG. 6C shows the terminal information. FIG. 6D shows signal line information.

The command input unit 301 may be a keyboard and/or a mouse and is used by the user to input various design commands. The design command has the following command types: a component placement command, a wiring command, and a tamper-resistance specification command. It is supposed here that the tamper-resistance specification command is input and a signal line 525 connecting a terminal 523 with a terminal 524 is specified as a signal line that requires tamper-resistance.

The command analyzing unit 303 analyzes a design command input to the command input unit 301, and determines the command type.

The design information storage unit 308 stores the circuit diagram information and the design information input by the data input unit 302.

The outside layer wiring setting unit 304 refers to the design information stored in the design information storage unit 308 and sets an area on an outside layer covered by a component as an outside layer wiring possible area.

The via setting unit 305 refers to the design information stored in the design information storage unit 308, detects an area where the outside area wiring possible are a of a front outside layer (layer 1) overlaps the outside area wiring possible area of a back outside layer (layer 2), and sets the detected area as a via possible area in which a via used for wiring a tamper-resistant signal line can be included.

The inside layer wiring setting unit 306 refers to the design information stored in the design information storage unit 308 and sets a wiring layer being an inside layer as an inside layer wiring possible area.

FIG. 7A shows an outside layer wiring possible area. FIG. 7B shows a via possible area. FIG. 7C shows an inside layer wiring possible area.

The wiring information generating unit 307 determines a wiring pattern so that signal lines that require tamper-resistance are wired only in the outside layer wiring possible areas, via possible areas, and inside layer wiring possible areas, and the other signal lines are wired in wiring possible areas, and generates wiring information that shows the determined wiring pattern. FIG. 8 shows generated wiring information.

Operation

The operation of the design apparatus of the present invention will be explained using the board shown in FIGS. 5A and 5B as an example.

Figure 9:
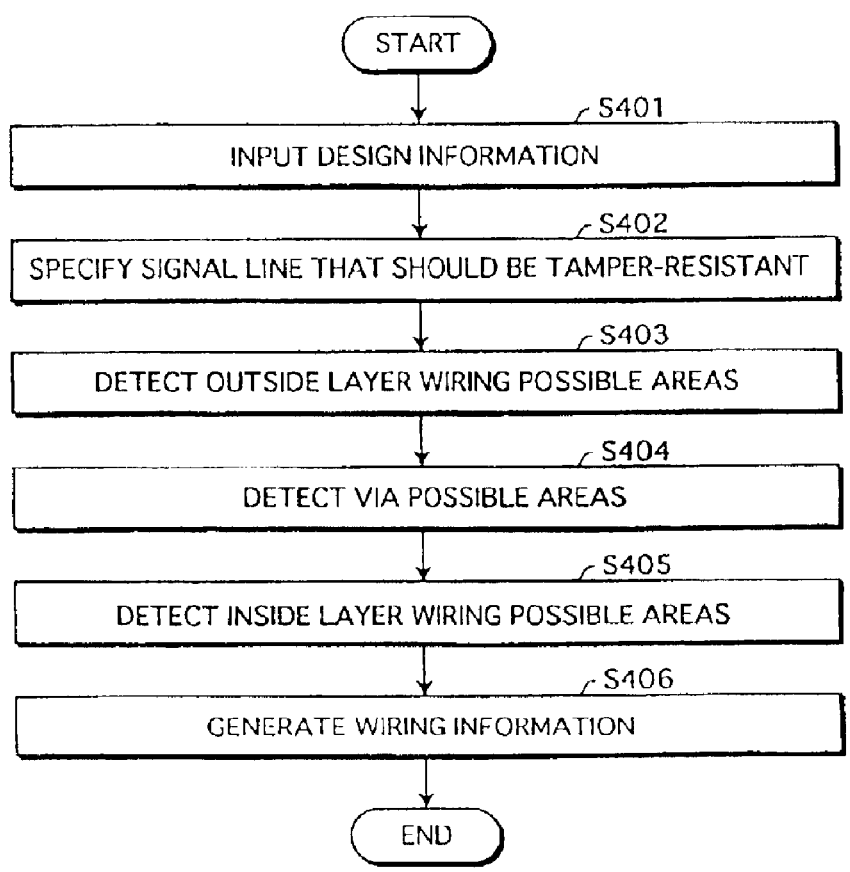
FIG. 9 is a flowchart showing an operation procedure of the design apparatus of Embodiment 3.

FIG. 9 is a flowchart showing an operation procedure of the design apparatus of Embodiment 3.

The data input unit 302 inputs design information into the design information storage unit 308 (step S401).

The command input unit 301 inputs a tamper-resistance specification command that specifies the signal line 525 as a signal line that requires tamper-resistance (step S402).

The outside layer wiring setting unit 304 refers to the design information, detects that areas 502, 504, and 506 are covered by the components 501, 503, and 505 on the first layer 513 being an outside layer of the board, and sets the areas 502, 504, and 506 as the outside layer wiring possible areas on the first layer 513.

The outside layer wiring setting unit 304 refers to the design information, detects that areas 508, 510, and 512 are covered by the components 507, 509, and 511 on the sixth layer 518 being another outside layer of the board, and sets the areas 508, 510, and 512 as the outside layer wiring possible areas on the sixth layer 518 (step S403).

The via setting unit 305 detects that the areas 519, 520, and 521 are areas where the outside area wiring possible areas 502, 504, and 506 of the first layer overlaps the outside area wiring possible areas 508, 510, and 512 of the sixth layer, and sets the areas 519, 520, and 521 as via possible areas (step S404).

The inside layer wiring setting unit 306 sets the inside layers 514 (the second layer), 515 (the third layer), 516 (the fourth layer), and 517 (the fifth layer) as inside layer wiring possible areas 522 (step S405).

The wiring information generating unit 307 determines a wiring pattern so that the signal line 525 that requires tamper-resistance is wired only in the outside layer wiring possible areas 502, 504, 506, 508, 510, and 512, via possible areas 519, 520, and 521, and inside layer wiring possible area 522 using the Lee's algorithm, and generates wiring information that shows the determined wiring pattern (step S406).

SUMMARY

As described above, the design apparatus of the present embodiment can determine a wiring pattern so that portions of the signal line that that require tamper-resistance are placed under components on outside layers, after the positions of the components are determined. This makes it possible to design a highly tamper-resistant multilayer board having a signal line that is difficult to contact probing.

Variations

The present invention is not limited to the above-described embodiment and can be varied as follows.

(1) The present embodiment determines a wiring pattern so that portions (sheets of foil and via ends) of a signal line that requires tamper-resistance are hidden under components on outside layers in order to make the signal line to be difficult to contact probing. However, to make the signal line to be difficult to non-contact probing as well, every portion of the signal line in and on the inside layers may be included in spaces that are overlaps among the areas covered by components on the two outside layers, when viewed from above and below, so that the portions of the signal line are hidden under the components when viewed from above and below.

Furthermore, it is possible to make the portions of the signal line on the first layer to become difficult to non-contact probing performed from the sixth layer, by placing the portions of the signal line on the first layer in an area that overlaps an area covered by a component on the sixth layer.

(2) In the present embodiment, the command input unit 301 specifies a signal line that requires tamper-resistance. However, the information specifying the signal line may be input as a part of the signal line information and stored in the design information storage unit 308.

(3) In the present embodiment, the wiring information generating unit 307 determines the wiring pattern using the Lee's algorithm. However, not limited to this, other methods may be used. Alternatively, the designer may determine the wiring pattern manually.

Embodiment 4

The present embodiment relates to a design apparatus that determines a wiring pattern so that portions of the signal line that requires tamper-resistance are wired on inside layers sandwiched between two ground/power-source layers.

Construction

Figure 10:
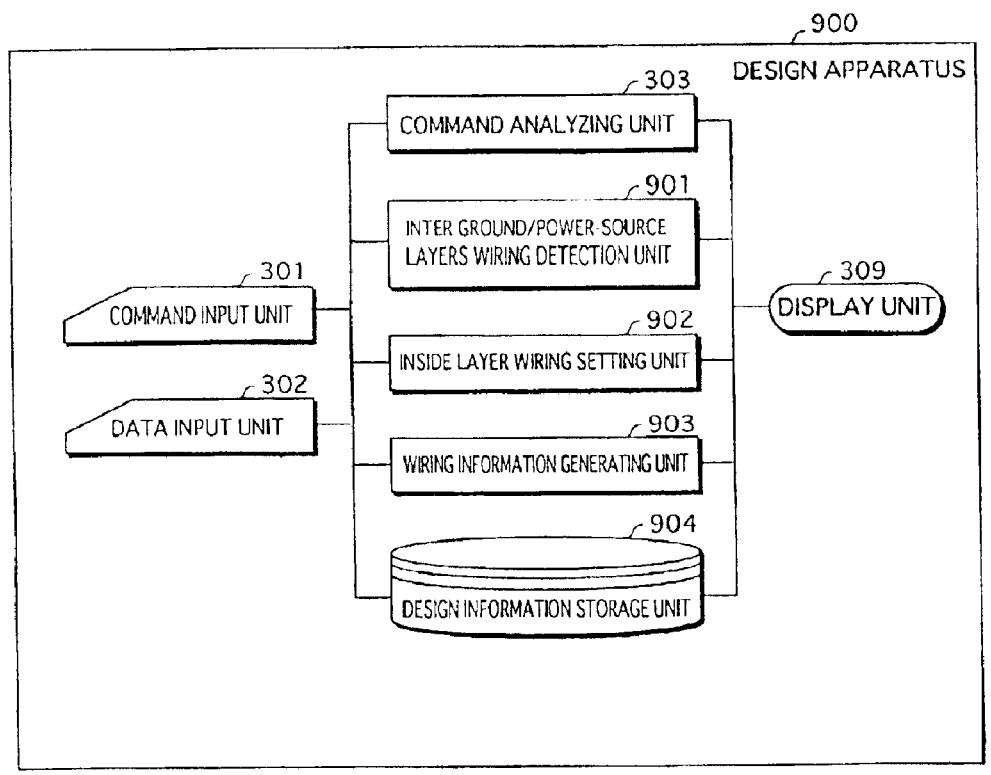
FIG. 10 is a block diagram showing the construction of a design apparatus in Embodiment 4.

FIG. 10 is a block diagram showing the construction of a design apparatus in Embodiment 4. As shown in FIG. 10, the design apparatus 900 includes a command input unit 301, a data input unit 302, a command analyzing unit 303, an inter ground/power-source layers wiring detection unit 901, an inside layer wiring setting unit 902, a wiring information generating unit 903, a design information storage unit 904, and a display unit 309. The same components in FIGS. 3 and 10 have the same numbers and will not be explained in detail here. Differences will be focused in the following description.

Figure 11:
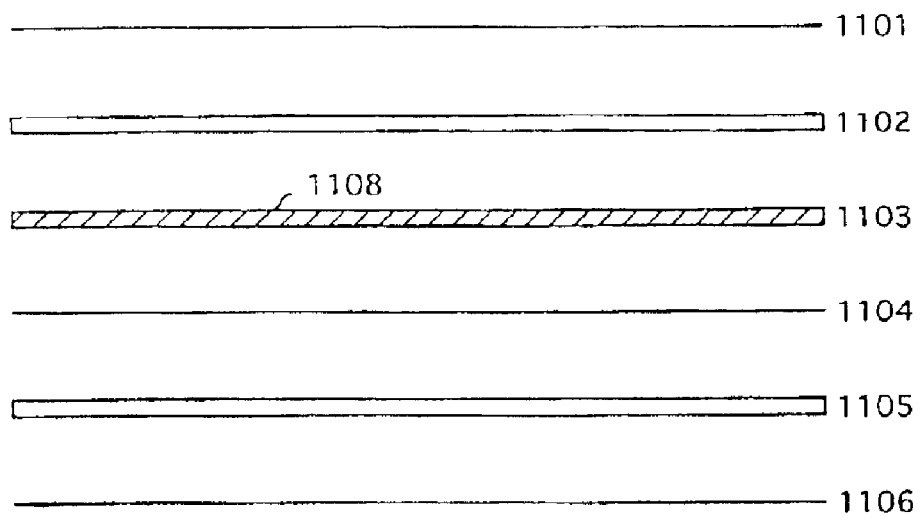
FIG. 11 shows a six-layer board.

FIG. 11 shows a six-layer board. Now, the components of the design apparatus will be described with reference to FIG. 11.

The design information storage unit 904 stores the circuit diagram information and the design information input by the data input unit 302. The design information includes board information, component information, and terminal information. FIG. 12A shows the board information. As shown in FIG. 12A, the board information contains information that indicates layers designed as ground/power-source layers. FIG. 12B shows the component information. FIG. 12C shows the terminal information. FIG. 12D shows signal line information.

The inter ground/power-source layers wiring detection unit 901 detects wiring layers that exist between ground/power-source layers as inter ground/power-source layers.

Figure 13:
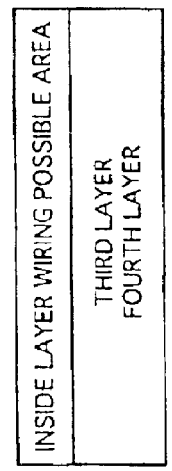
FIG. 13 shows the inside layer wiring possible areas.

The inside layer wiring setting unit 902 sets the detected inter ground/power-source layers as inside layer wiring possible areas. FIG. 13 shows the inside layer wiring possible areas set by the inside layer wiring setting unit 902. As shown in FIG. 13, the third and fourth layers sandwiched between the ground/power-source layers (the second layer and the fifth layer) are set as the inside layer wiring possible areas.

The wiring information generating unit 903 determines a wiring pattern so that signal lines that require tamper-resistance are wired in the inside layer wiring possible areas in terms of the inside layer, and generates wiring information that shows the determined wiring pattern. FIG. 14 shows generated wiring information.

Operation

The operation of the design apparatus of the present invention will be explained using the board shown in FIGS. 12A through 12D as an example.

Figure 15:
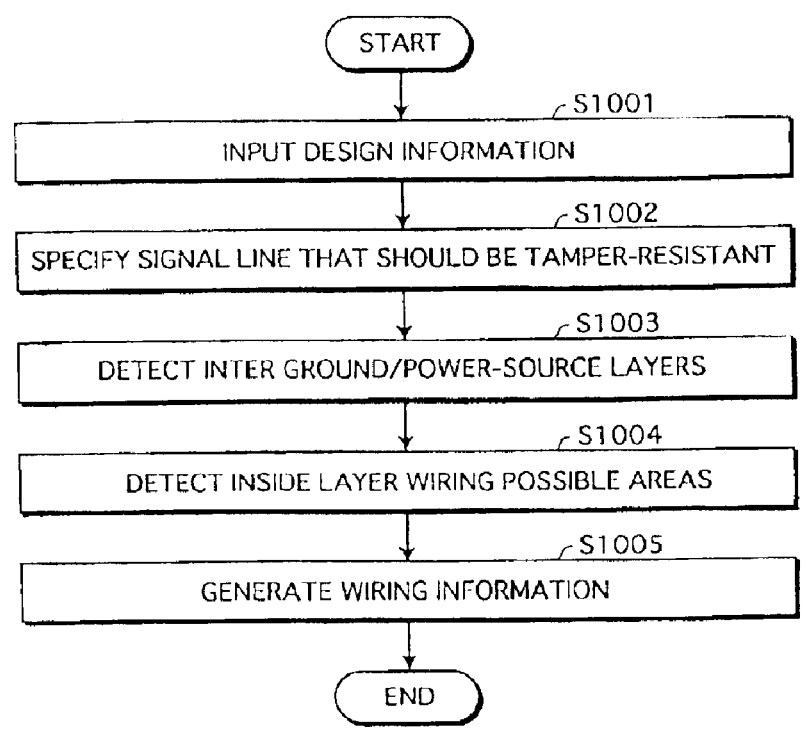
FIG. 15 is a flowchart showing an operation procedure of the design apparatus of Embodiment 4.

FIG. 15 is a flowchart showing an operation procedure of the design apparatus of Embodiment 4.

The data input unit 302 inputs design information into the design information storage unit 904 (step S1001).

The command input unit 901 inputs a tamper-resistance specification command that specifies the signal line 1155 as a signal line that requires tamper-resistance (step S1002). The inter ground/power-source layers wiring detection unit 901 refers to the design information and detects the third layer 1103 and the fourth layer 1104 that exist between the ground/power-source layers (the second layer 1102 and the fifth layer 1105) as inter ground/power-source layers (step S1003).

The inside layer wiring setting unit 902 sets the third layer 1103 and the fourth layer 1104 as inside layer wiring possible areas (step S1004).

The wiring information generating unit 903 determines a wiring pattern so that the signal line 1155 that requires tamper-resistance includes a portion 1108 on the third layer 1103 being an inside layer wiring possible area, and generates wiring information that shows the determined wiring pattern (step S1005).

SUMMARY

As described above, the design apparatus of the present embodiment can determine a wiring pattern so that portions of the signal line that requires tamper-resistance are wired on inside layers sandwiched between two ground/power-source layers. This makes it possible to design a highly tamper-resistant multilayer board having a signal line that is difficult to non-contact probing.

Embodiment 5

The present embodiment relates to a design apparatus that determines positions of components connecting to a certain signal line, determines a wiring pattern of the certain signal line, and then if there is a portion of the signal line not hidden under a component on an outside layer, places a component, which has not been placed yet, to cover the exposed portion.

Construction

Figure 16:
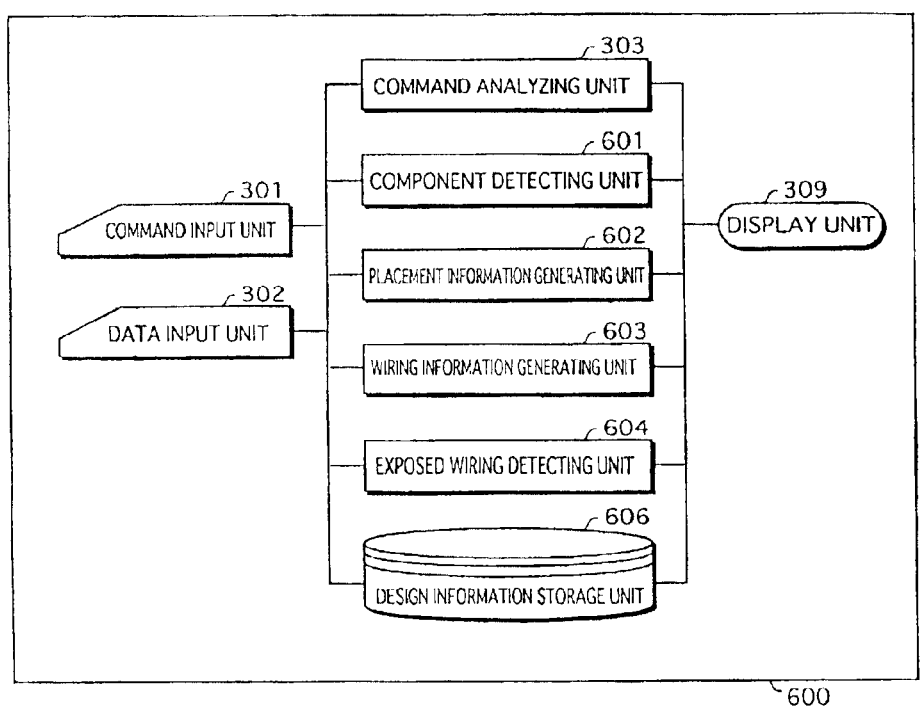
FIG. 16 is a block diagram showing the construction of a design apparatus in Embodiment 5.

FIG. 16 is a block diagram showing the construction of a design apparatus in Embodiment 5. As shown in FIG. 16, the design apparatus 600 includes a command input unit 301, a data input unit 302, a display unit 309, a command analyzing unit 303, a component detecting unit 601, a placement information generating unit 602, a wiring information generating unit 603, an exposed wiring detecting unit 604, and a design information storage unit 606. The same components in FIGS. 3 and 16 have the same numbers and will not be explained in detail here. Differences will be focused in the following description.

Figure 17A:
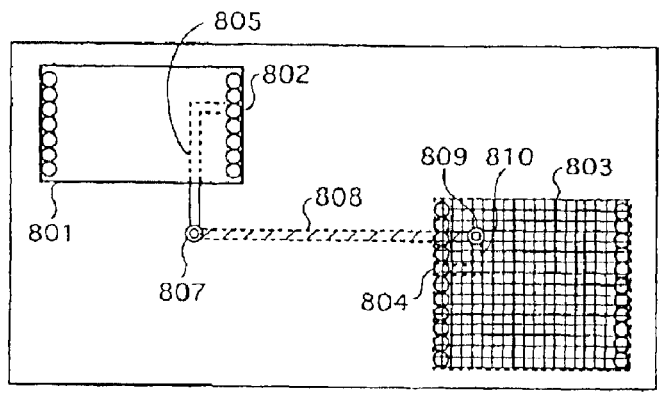
FIGS. 17A to 17C show processes in designing a four-layer board.
Figure 17B:
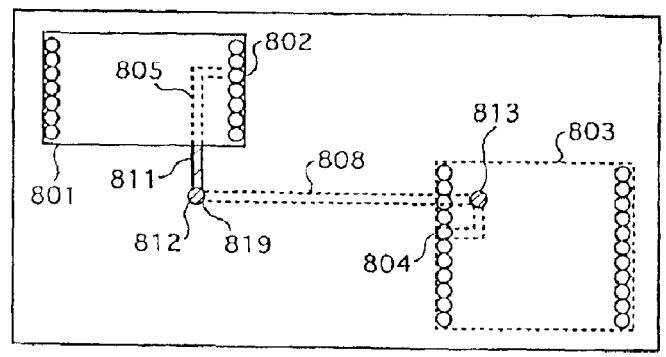
Figure 17C:
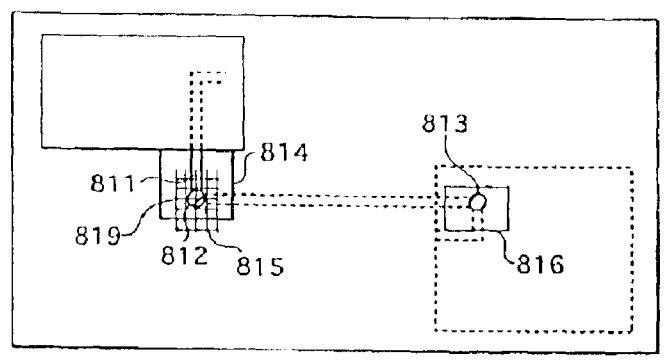

FIGS. 17A to 17C show processes in designing a four-layer board. Now, the components of the design apparatus will be described with reference to FIGS. 17A to 17C.

The design information storage unit 606 stores the circuit diagram information and the design information input by the data input unit 302. The design information includes board information, component information, and signal line information. FIG. 18A shows the board information. FIG. 18B shows the component information. FIG. 18C shows the signal line information.

The command input unit 301 and the command analyzing unit 303 input and analyze a command that specifies a signal line that requires tamper-resistance among the signal lines shown in the signal line information. In this example, it is supposed that a signal line 888 connecting a terminal 802 with a terminal 804 is specified as a signal line that requires tamper-resistance.

The component detecting unit 601 refers to the design information and detects components that connect to the signal line that requires tamper-resistance. In this example, it is supposed that the components 801 and 802 that connect to the signal line 888 are detected.

The placement information generating unit 602 determines the positions of the components detected by the component detecting unit 601 so that the positions satisfy the designing conditions, and generates placement information that shows the determined positions. FIG. 19A shows the placement information that shows the determined positions of the components connecting to the signal line that requires tamper-resistance. It should be noted here that in determining the positions of the components, the placement information generating unit 602 first assigns the position of exposed wiring detected by the exposed wiring detecting unit 604 to a component, and generates placement information that shows the determined positions of the components. FIG. 21 shows the generated placement information.

The wiring information generating unit 603 determines a wiring pattern of signal lines that connect terminals, and generates wiring information that shows the determined wiring pattern. The wiring pattern may be determined manually by a designer or automatically determined using a wiring algorithm such as the Lee's algorithm. FIG. 19B shows the wiring information.

The exposed wiring detecting unit 604 detects an exposed portion of the signal line among the signal lines of which the wiring information generating unit 603 has determined the wiring pattern, the exposed portion of the signal line being a portion outside an area covered by a component. FIG. 20 shows the exposed wiring.

Operation

The operation of the design apparatus of the present invention will be explained using the board designing processes shown in FIGS. 17A through 17C.

Figure 22:
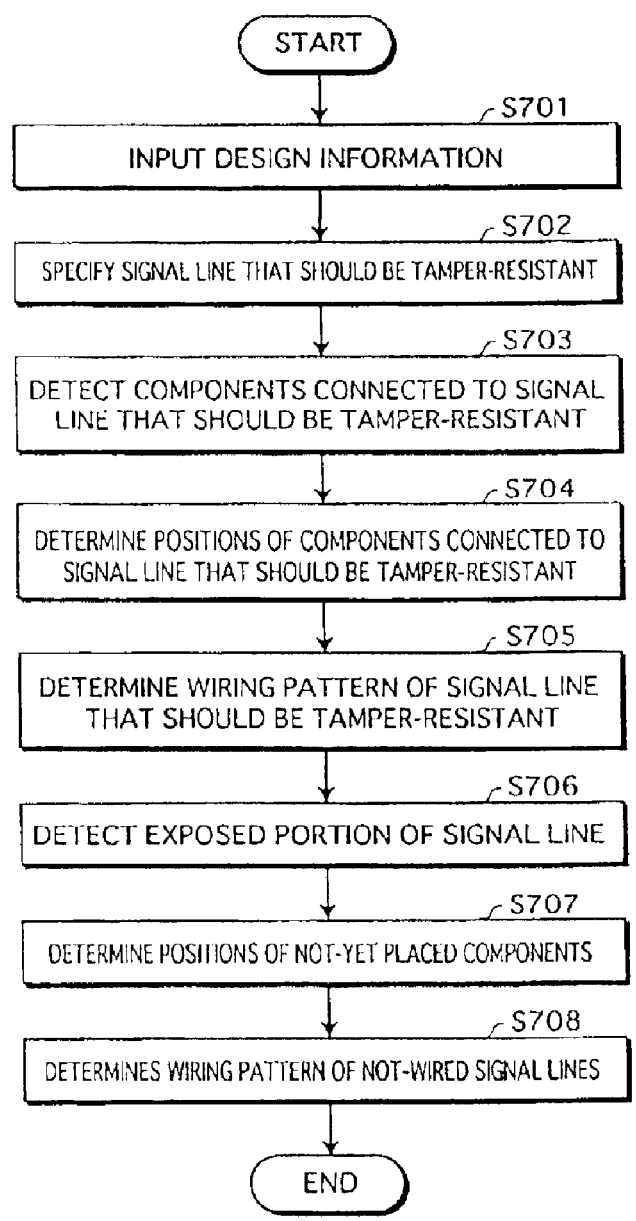
FIG. 22 is a flowchart showing an operation procedure of the design apparatus of Embodiment 5.

FIG. 22 is a flowchart showing an operation procedure of the design apparatus of Embodiment 5.

The data input unit 302 inputs design information into the design information storage unit 606 (step S701).

The command input unit 301 inputs a tamper-resistance specification command that specifies the signal line 888 connecting the terminal 802 and the terminal 804 as a signal line that requires tamper-resistance (step S702).

The component detecting unit 601 refers to the design information and detects the components 801 and 802 that connect to the signal line 888 that requires tamper-resistance (step S703).

The placement information generating unit 602 determines the positions of the components 801 and 802 so that the positions satisfy the designing conditions, and generates placement information that shows the determined positions (step S704). Note that the positions may be anywhere on the board in so far as they satisfy the designing conditions.

The wiring information generating unit 603 determines a wiring pattern between the terminals 802 and 804, and generates wiring information that shows the determined wiring pattern. The wiring pattern may be determined manually by a designer or automatically determined using a wiring algorithm such as the Lee's algorithm. In the case of the automatic determination, a conventional wiring algorithm such as the Lee's algorithm may be used in so far as the wiring algorithm satisfies the specified wiring design standard. In this example, it is supposed that the terminal 802 is connected with the terminal 804 by the foil 805 on the first layer, the via 807, the foil 808 on an inside layer, the via 809, and the foil 810 on the fourth layer, as shown in FIG. 17A (step S705).

The exposed wiring detecting unit 604 detects an exposed portion of the signal line among the signal lines of which the wiring information generating unit 603 has determined the wiring pattern, the exposed portion of the signal line being a portion outside an area covered by a component. In this example, it is supposed that the foil 811 and the via ends 812 and 813 on the first layer and the via end 819 on the fourth layer are detected as exposed wiring, as shown in FIG. 17B (step S706).

The placement information generating unit 602 determines the positions of the components by first assigning the position of exposed wiring, and generates placement information that shows the determined positions of the components. As shown in FIG. 17C, on the first layer, the component 814 is placed to cover the foil 811 and the via end 812 that are the exposed wiring, and on the fourth layer, the component 815 is placed to cover the via end 819 being the exposed wiring, and on the first layer, the component 816 is placed to cover the via end 813 being the exposed wiring (step S707).

The wiring information generating unit 603 determines a wiring pattern of signal lines, and generates wiring information that shows the determined wiring pattern (step S708).

SUMMARY

As described above, the design apparatus of the present embodiment (1) determines positions of components connecting to a signal line that requires tamper-resistance, (2) determines a wiring pattern of the signal line that requires tamper-resistance, then (3) if there is a portion of the signal line not hidden under a component on an outside layer, places a component, which has not been placed yet, to cover the exposed portion. This makes it possible to design a highly tamper-resistant multilayer board having a signal line that is difficult to contact probing.

Variations

The present invention is not limited to the above-described embodiment and can be varied as follows.

Figure 23:
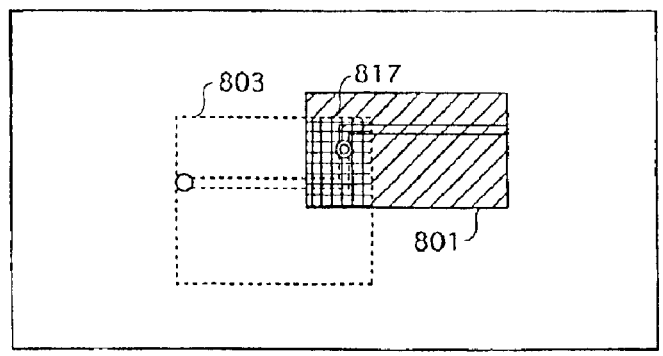
FIG. 23 shows another method for placing components.

(1) The placement information generating unit 602 may place the component 801 connecting to the signal line that requires tamper-resistance onto the first layer, and place the component 803 on an area on the sixth layer that overlaps an area covered by the component 801 on the first layer, as shown in FIG. 23.

(2) In the present embodiment, if there is a portion of the signal line (which requires tamper-resistance) not hidden under a component on an outside layer, the design apparatus determines a placement pattern so as to place a component, which has not been placed yet, to cover the exposed portion. This makes the signal line difficult to contact probing. However, to make the signal line difficult to non-contact probing as well, if there is a portion of the signal line in inside layers that is not sandwiched between components on the two outside layers, the design apparatus may determine a placement pattern so as to place a component, which has not been placed yet, to be directly above or below the portion in inside layers.

Furthermore, if there is, on the first layer, a portion of the signal line not placed in an area which does not correspond to any component on the sixth layer (the opposite outside layer) in a vertical direction, the design apparatus may place a component on the sixth layer, which has not been placed yet, to correspond to the area on the first layer to make the signal line difficult to non-contact probing.

(3) In the present embodiment, the design apparatus determines (a) positions of components connecting to a signal line that requires tamper-resistance and (b) a wiring pattern of the signal line requiring tamper-resistance. However, the design apparatus may receive design information that specifies (a) positions of components connecting to a signal line that requires tamper-resistance and (b) a wiring pattern of the signal line requiring tamper-resistance, then the design apparatus may determine position of a component which has not been placed yet, to cover an exposed portion of the signal line.

Embodiment 6

The present embodiment relates to a design apparatus that determines positions of planes so as to sandwich a portion of a signal line that requires tamper-resistance, the portion being placed on an inside layer, after a wiring pattern of the signal line is determined.

Construction

Figure 24:
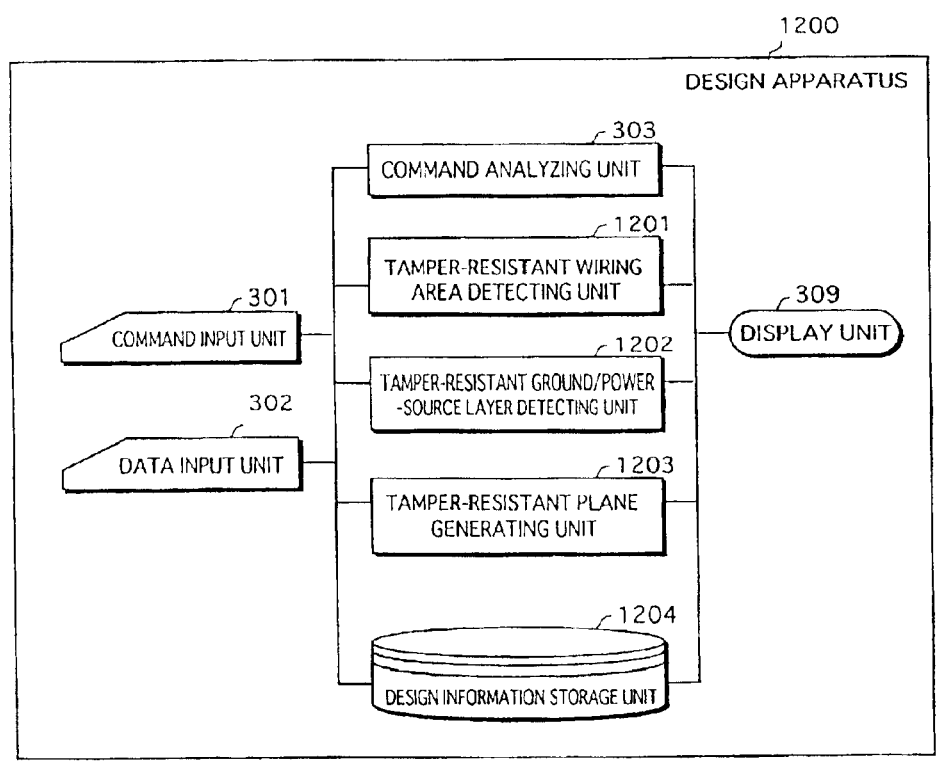
FIG. 24 is a block diagram showing the construction of a design apparatus in Embodiment 6.

FIG. 24 is a block diagram showing the construction of a design apparatus in Embodiment 6. As shown in FIG. 24, the design apparatus 1200 includes a command input unit 301, a data input unit 302, a command analyzing unit 303, a tamper-resistant wiring area detecting unit 1201, a tamper-resistant ground/power-source layer detecting unit 1202, a tamper-resistant plane generating unit 1203, and a design information storage unit 1204. The same components in FIGS. 3 and 24 have the same numbers and will not be explained in detail here. Differences will be focused in the following description.

Figure 25:
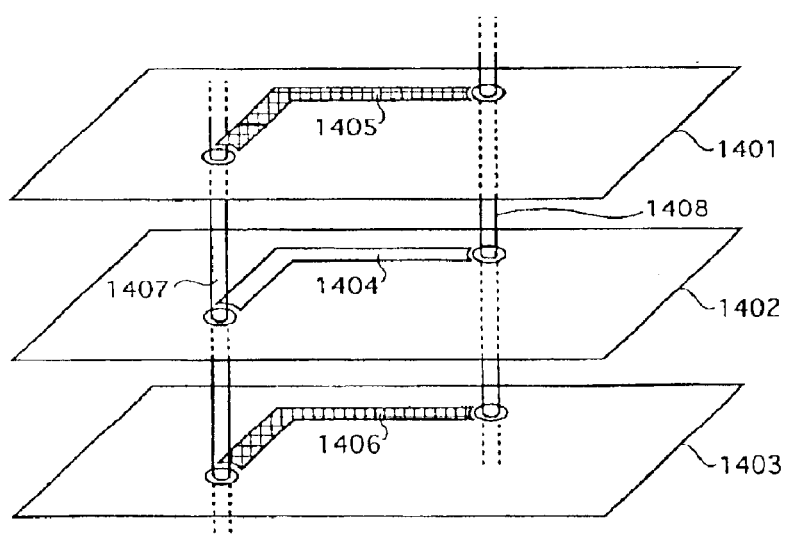
FIG. 25 shows a multilayer board.

FIG. 25 shows a multilayer board. Now, the components of the design apparatus will be described with reference to FIG. 25.

The design information storage unit 1204 stores the circuit diagram information and the design information input by the data input unit 302. The design information includes board information, component information, signal line information, and terminal information. FIG. 26A shows the board information. FIG. 26B shows the component information. FIG. 26C shows the terminal information. FIG. 26D shows the signal line information. FIG. 26E shows the wiring information.

The tamper-resistant wiring area detecting unit 1201 refers to the design information and detects a tamper-resistant wiring area which is a wiring area in the inside layers and in which a portion of a signal line that requires tamper-resistance is placed. FIG. 27A shows the detected tamper-resistant wiring area.

The tamper-resistant ground/power-source layer detecting unit 1202 detects two inside layers that sandwich an inside layer on which a portion of the signal line that requires tamper-resistance is placed, and sets the detected layers as the tamper-resistant ground/power-source layers. FIG. 27B shows the tamper-resistant ground/power-source layers.

The tamper-resistant plane generating unit 1203 generates plane placement information that indicates that planes (sheets of foil) should be placed on the tamper-resistant ground/power-source layers so as to sandwich the detected tamper-resistant wiring area in a vertical direction. FIG. 28 shows the generated plane placement information.

Operation

The operation of the design apparatus of the present invention will be explained using the board shown in FIG. 25.

Figure 29:
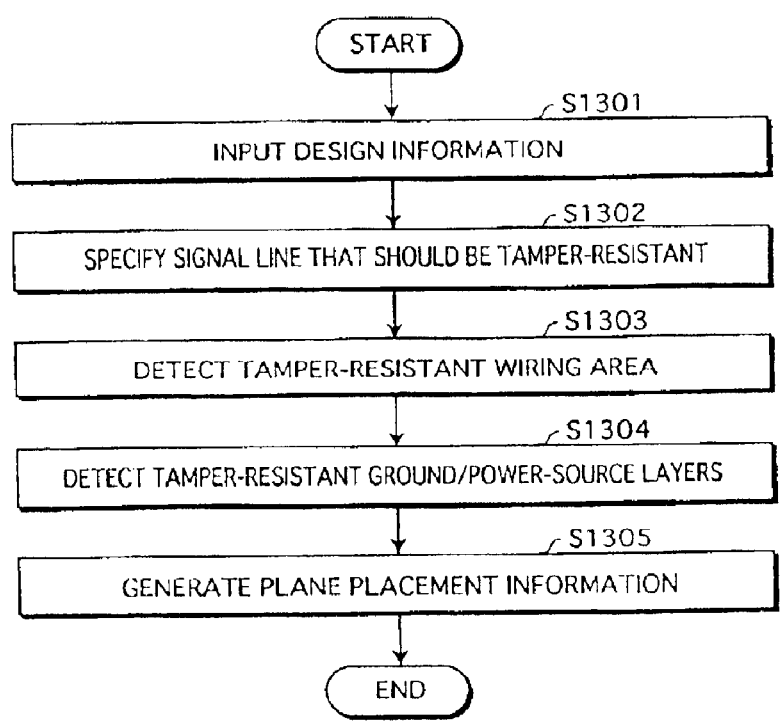
FIG. 29 is a flowchart showing an operation procedure of the design apparatus of Embodiment 6.

FIG. 29 is a flowchart showing an operation procedure of the design apparatus of Embodiment 6.

The data input unit 302 inputs design information into the design information storage unit 1204 (step S1301).

The command input unit 301 inputs a tamper-resistance specification command that specifies the signal line 1455 as a signal line that requires tamper-resistance (step S1302).

The tamper-resistant wiring area detecting unit 1201 detects a tamper-resistant wiring area 1404 (step S1303).

The tamper-resistant ground/power-source layer detecting unit 1202 detects the second layer 1401 and the fourth layer 1403 sandwiching the third layer 1402 on which a portion 1404 of the signal line that requires tamper-resistance is placed, and sets the detected layers as the tamper-resistant ground/power-source layers (step S1304).

The tamper-resistant plane generating unit 1203 generates plane placement information that indicates that planes (sheets of foil) 1405 and 1406 should be placed on the tamper-resistant ground/power-source layers (namely, the second layer 1401 and the fourth layer 1403) so as to sandwich the detected tamper-resistant wiring area (namely, an area containing the portion 1404) in a vertical direction (step S1305).

SUMMARY

As described above, after a wiring pattern of a signal line that requires tamper-resistance is determined, the design apparatus of the present embodiment determines positions of planes so as to sandwich a portion of the signal line on an inside layer. This makes it possible to design a highly tamper-resistant multilayer board having a signal line that is difficult to non-contact probing.

Variations

The present invention is not limited to the above-described embodiment and can be varied as follows.

(1) In the present embodiment, the planes sandwiching a portion of the signal line that requires tamper-resistance are not connected to a ground or a power source. However, to enhance the shielding effect, the planes may be connected to a ground or a power source.

Embodiment 7

The present embodiment relates to a wiring check apparatus that checks whether a wiring pattern has been designed so that a signal line that requires tamper-resistance has tamper-resistance, in the middle of or after a design of a multilayer board.

Construction

Figure 30:
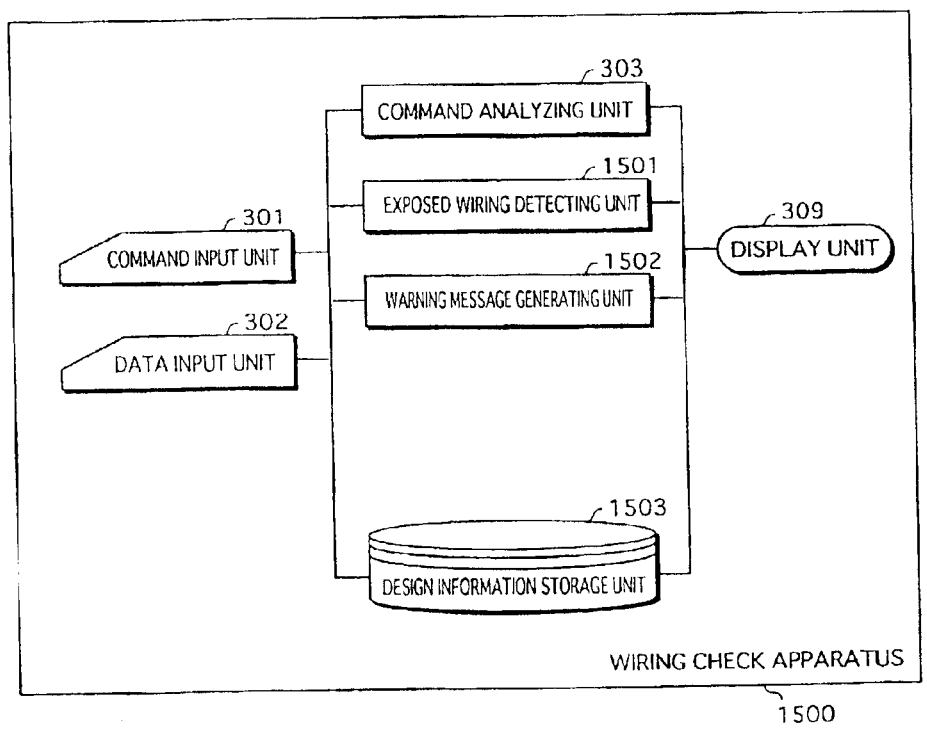
FIG. 30 is a block diagram showing the construction of a wiring check apparatus in Embodiment 7.

FIG. 30 is a block diagram showing the construction of a wiring check apparatus in Embodiment 7. As shown in FIG. 30, the wiring check apparatus 1500 includes a command input unit 301, a data input unit 302, a command analyzing unit 303, an exposed wiring detecting unit 1501, a warning message generating unit 1502, a display unit 309, and a design information storage unit 1503.

The same components in FIGS. 3 and 30 have the same numbers and will not be explained in detail here. Differences will be focused in the following description.

FIGS. 31A and 31B show a multilayer board. Now, the components of the design apparatus will be described with reference to FIGS. 31A and 31B.

The design information storage unit 1503 stores the circuit diagram information and the design information input by the data input unit 302. The design information includes board information, component information, and terminal information. FIG. 32A shows the board information FIG. 32B shows the component information. FIG. 32C shows the terminal information. FIG. 32D shows the signal line information. As shown in FIG. 32D, the signal line information contains information that indicates whether the signal line requires tamper-resistance. FIG. 32E shows the wiring information.

The exposed wiring detecting unit 1501 refers to the design information and detects (a) sheets of foil and via ends that constitute a signal line that requires tamper-resistance and appear on an outside layer and (b) area on the outside layer covered by components. The exposed wiring detecting unit 1501 then detects sheets of foil and via ends that are not covered by any components on the outside layer and are called exposed wiring, and sends exposed wiring information indicating the exposed foil and via ends to the warning message generating unit 1502. FIG. 33 shows the exposed wiring information.

The warning message generating unit 1502 generates a warning message in accordance with the exposed wiring information received from the exposed wiring detecting unit 1501.

The display unit 309 displays the warning message generated by the warning message generating unit 1502. FIG. 31B shows an example of a displayed warning message.

Operation

The operation of the wiring check apparatus of the present invention will be explained using the board shown in FIG. 31.

Figure 34:
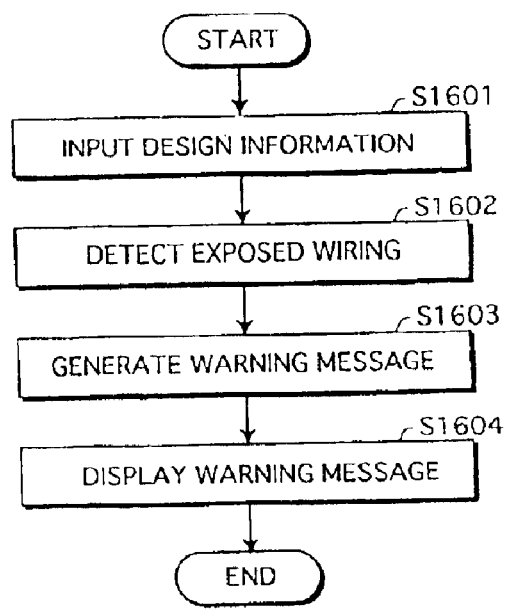
FIG. 34 is a flowchart showing an operation procedure of the wiring check apparatus of Embodiment 7.

FIG. 34 is a flowchart showing an operation procedure of the wiring check apparatus of Embodiment 7.

The data input unit 302 inputs design information into the design information storage unit 1503 (step S1601).

The exposed wiring detecting unit 1501 refers to the design information and detects foil 1701 and a via end 1703 that constitute a signal line that requires tamper-resistance and appear on an outside layer, and detects a covered area 1706 covered by a component 1705 on the outside layer.

The exposed wiring detecting unit 1501 then detects foil 1707 and a via end 1709 that are exposed wiring not included in the covered area 1706, and sends exposed wiring information indicating the exposed foil 1707 and via end 1709 to the warning message generating unit 1502 (step S1602).

The warning message generating unit 1502 generates a warning message in accordance with the exposed wiring information received from the exposed wiring detecting unit 1501 (step S1603).

The display unit 309 displays the warning message 1708 generated by the warning message generating unit 1502 (step S1604).

SUMMARY

As described above, the wiring check apparatus of the present embodiment detects a portion of a signal line that requires tamper-resistance but is not covered by any components on an outside layer, and displays a warning message that indicates the detected portion. This enables one to check if a tamper-resistant design has been done.

Variations

The present invention is not limited to the above-described embodiment and can be varied as follows.

(1) The warning message shown in FIG. 31B is one example. The message may be displayed by highlighting or using a different color for the exposed wiring 1707. Data such as the layer on which the exposed wiring 1707 exists or the coordinates of the position may be output to file.

(2) In the present embodiment, the wiring check apparatus detects a portion of a signal line that requires tamper-resistance but is not covered by any components on an outside layer, and displays a warning message that indicates the detected portion. As one variation, if a signal line that requires tamper-resistance has, on one inside layer, a portion that is not sandwiched between components or sheets of foil on the outside layers, a warning message indicating the portion may be displayed. Furthermore, as another variation, if a signal line requiring tamper-resistance has a portion on one outside layer and the opposite outside layer has no component that corresponds to the area in the vertical direction, a warning message indicating the portion may be displayed.

(3) The present invention may be a design method or a wiring check method having the steps described in the above embodiments. The present invention may be a computer program that allows a computer to execute these methods. The present invention may be a computer-readable recording medium on which the program is recorded.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A multilayer board on whose outside layer, one or more circuit components are mounted, the multilayer board comprising:

a signal line requiring tamper-resistance, the signal line being connected to a predetermined component among the one or more circuit components and including: (a) a conductive and (b) a conductive via that passes through layers of the multilayer board, wherein the conductive trace and an end of the conductive via existing on the outside layer of the multilayer board are placed only under the predetermined component, and not on the other area of the outside layer.

2. The multilayer board of claim 1, wherein the signal line further includes a conductive trace on an inner layer that is sandwiched between sheets of foil and/or circuit components placed on layers above and below the inner layer so that the sheets of foil and/or circuit components hide the conductive trace on the inner layer when viewed from above or below.

3. The multilayer board of claim 2, wherein the sheets of foil placed on the layers that are outside the inner layer are connected to either a ground or a power source.

4. The multilayer board of claim 3, wherein the conductive trace on the outside layer is further covered by a circuit component on another outside layer when viewed from above or below.

5. The multilayer board of claim 2, wherein the signal line requiring tamper-resistance is either a signal line that is input to an encryption unit or a signal line that is output from a decryption unit.

6. A multilayer board on whose outside layer, one or more circuit components are mounted, the multilayer board comprising:

a certain signal line that is connected to a predetermined component among the one or more circuit components and includes (a) a conductive trace and (b) a conductive via that passes through layers of the multilayer board, wherein the conductive trace and an end of the conductive via existing on the outside layer of the multilayer board are placed only under the predetermined component, and not on the other area of the outside layer, the certain signal line further includes a conductive trace on an inner layer of the multilayer board, the conductive trace being sandwiched between sheets of foil and/or circuit components placed on layers above and below the inner layer so that the sheets of foil and/or the predetermined component hide the conductive trace on the inner layer when viewed from above or below, and the certain signal line is either a data line or an address line.

7. A tamper-resistant multilayer board for transfer of pixel data to be encrypted comprising:

a board member having a plurality of layers and one or more components mounted thereon;

a reception/decryption unit mounted on the board member;

an output interface unit mounted on the board member and operatively connected to the reception/decryption unit; and a conductive path operatively designed for interconnecting the reception/decryption unit and the output interface unit and positioned adjacent an interior layer surface for a first portion of the conductive path and positioned only under the reception/decryption unit and/or the output interface unit for a second portion of the conductive path on an outside layer of the multilayer board to prevent direct access to the second portion of the conductive path from the exterior of the board member.

* * * * *